United States Patent [19]
Paolella

[11] Patent Number: 5,637,862
[45] Date of Patent: Jun. 10, 1997

[54] DETECTOR FOR DETERMINING THE WAVELENGTH OF AN OPTICAL SIGNAL

[75] Inventor: Arthur Paolella, Howell, N.J.

[73] Assignee: The United States of America as represented by the Secretary of the Army, Washington, D.C.

[21] Appl. No.: 493,869

[22] Filed: Jun. 23, 1995

[51] Int. Cl.⁶ .................................................. H01J 40/14
[52] U.S. Cl. ...................... 250/214.1; 250/226; 257/440
[58] Field of Search ............................... 250/226, 214.1, 250/214 LS; 257/440, 53, 21-23, 441-443, 436, 459, 462

[56] References Cited

U.S. PATENT DOCUMENTS

| | | | |
|---|---|---|---|
| 4,749,851 | 6/1988 | Wolffenbuttel | 257/440 |
| 4,804,833 | 2/1989 | Matsubara et al. | 250/214 R |
| 4,975,567 | 12/1990 | Bishop et al. | 250/214.1 |
| 5,032,710 | 7/1991 | Nojiri | 250/226 |
| 5,270,536 | 12/1993 | Malhotra | 250/226 |

*Primary Examiner*—Que Le
*Attorney, Agent, or Firm*—Michael Zelenka; William H. Anderson

[57] ABSTRACT

An optical detector for determining the wavelength of an optical signal includes a semiconductor material in the path of the optical signal having a bandgap less than the optical signal. A conductive layer is positioned on the semiconductor material and a plurality of conductive pads are also positioned on the semiconductor material to delineate individual photodetectors. The pads have a common node established by the conductive layer. The optical detector produces a plurality of photocurrents between the pads and the conductive layer in response to the optical signal which photocurrents can be measured and compared to determine the wavelength of the optical signal. A system for determining the wavelength of the optical signal includes a plurality of optical detectors numbered 1 to n positioned sequentially in the path of the optical signal. The detectors produce photocurrents which are converted into digital signals. A microprocessor receives the digital signals and determines a ratio therebetween. A memory accessible by the microprocessor relates the ratio and the nth numbered detector to the wavelength of the optical signal.

13 Claims, 3 Drawing Sheets

5,637,862

DETECTOR FOR DETERMINING THE WAVELENGTH OF AN OPTICAL SIGNAL

GOVERNMENT INTEREST

The invention described herein may be manufactured, used and licensed by or for the Government for governmental purposes without the payment to me of any royalty thereon.

FIELD OF THE INVENTION

This invention relates in general to optical detectors for detecting the wavelength of an optical signal. The optical detector may detect one of several possible wavelengths in an optical signal.

BACKGROUND OF THE INVENTION

Prior optical detectors have used a plurality of semiconductor photodetectors, each with a different bandgap energy. As an incoming optical signal at a given energy level is incident on the photodetectors, a photocurrent is generated in those detectors that have a bandgap energy level less than the energy level of the optical signal. By observing which photodetectors do and do not produce a photocurrent, the energy level and thus the wavelength of the optical signal is known. This technique requires complicated and expensive epitaxial growth procedures to vary the bandgap energy level of each photodetector. Such fabrication techniques are complicated and expensive.

SUMMARY OF THE INVENTION

Among the objects of the present invention are to provide an improved optical detector using a semiconductor material; to provide an improved optical detector requiring only a single bandgap energy semiconductor material; to provide an improved optical detector made in a monolithic form; to provide an improved optical detector using inexpensive electronics for calculating the wavelength of the optical signal; to provide an improved optical detector which passes the optical signal through a single piece of material; to provide an improved optical detector which outputs a series of photocurrents for identifying the wavelength of the optical signal; to provide an improved optical detector using a plurality of contiguous, coaxial photodetectors; to provide an improved optical detector having a memory for associating the photocurrents from individual photodetectors to the wavelength of the optical signal; and to provide an improved optical detector which is small in size, reliable, efficient and inexpensive to manufacture.

Generally, in one form the invention provides an optical detector which produces a plurality of photocurrents in response to an optical signal. The photocurrents are used in determining a wavelength of the optical signal. The optical detector includes a semiconductor material in the path of the optical signal. The material has a bandgap less than the optical signal and the optical signal passes into the material. A conductive layer is positioned on the semiconductor material. The optical detector also includes a plurality of n conductive pads numbered 1 to n positioned on the semiconductor material. The pads delineate individual photodetectors and have a common node established by the conductive layer. The optical detector produces a plurality of photocurrents between the pads and the conductive layer in response to the optical signal. The photocurrents can be measured and compared to determine the wavelength of the optical signal.

Another form of the invention is an optical detector which produces a plurality of photocurrents in response to an optical signal. The photocurrents are used in determining a wavelength of the optical signal. The optical detector includes a plurality of photodetectors for receiving the optical signal. The photodetectors have an axis along which the optical signal passes. A support is positioned for supporting the photodetectors such that the axes of the photodetectors are coaxial. Opposing conductors on the photodetectors supply a photocurrent therebetween as the optical signal passes through the photodetectors.

Still another form of the invention is a system for determining a wavelength $\lambda$ of an optical signal. The system includes a plurality of optical detectors numbered 1 to n positioned sequentially in the path of the optical signal. The detectors produce photocurrents for use in determining the wavelength of the optical signal as the signal passes into the detectors. The system also includes an analog to digital converter which receives the photocurrents and converts them into digital signals. A microprocessor receives the digital signals and determines a ratio therebetween. A memory accessible by the microprocessor relates the ratio and the nth numbered detector to $\lambda$. A display is connected to the microprocessor. The microprocessor retrieves $\lambda$ from the memory as a function of the ratio and the nth numbered detector and displays the result on the display.

Other objects and features will be in part apparent and in part pointed out hereinafter.

BRIEF DESCRIPTION OF THE DRAWINGS

These and other objects, features, and details of the invention will become apparent in light of the ensuing detailed disclosure, and particularly in light of the drawings wherein.

DETAILED DESCRIPTION

Figure 1:
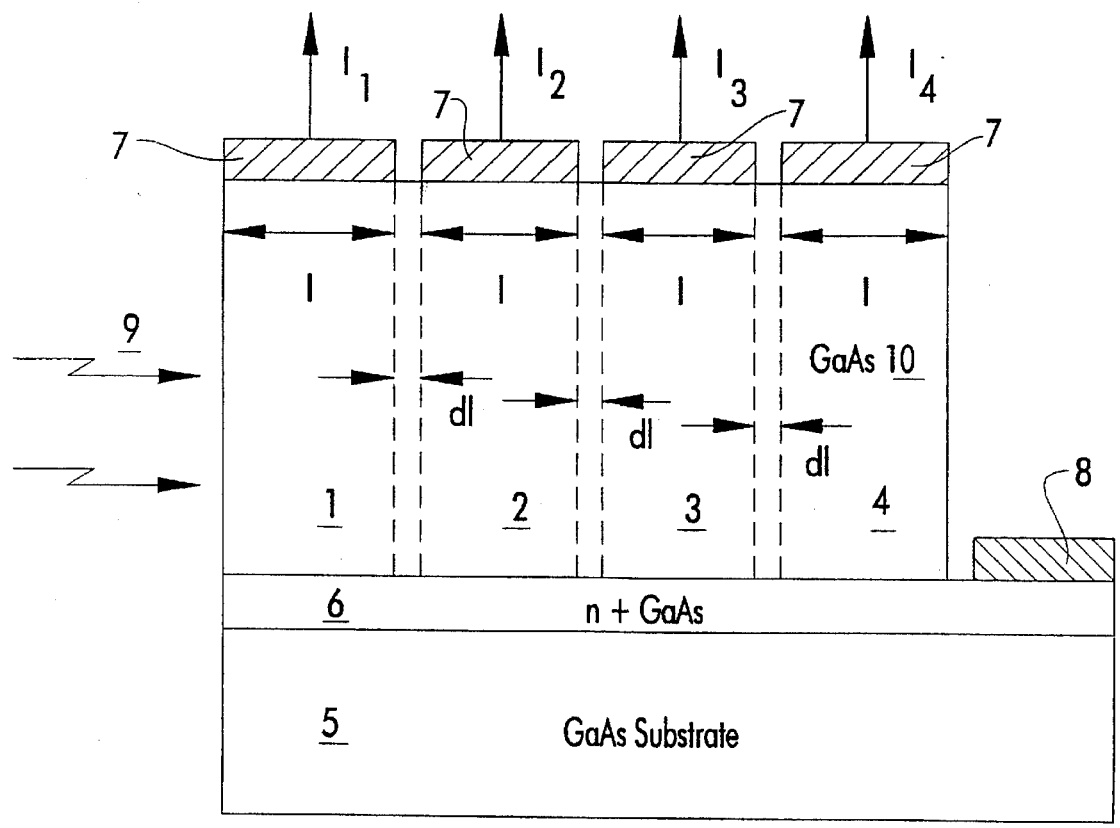
FIG. 1 is a schematic cross sectional diagram taken along lines 1—1 of FIG. 2 of an optical detector for wavelength analysis according to the invention.
Figure 2:
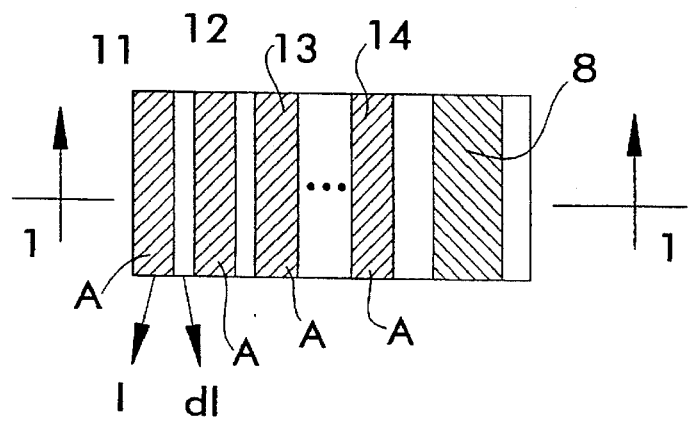
FIG. 2 is a schematic plan diagram of the top of the optical detector according to the invention shown in FIG. 1.

FIG. 1 shows a schematic cross sectional diagram taken along lines 1—1 of FIG. 2. FIG. 2 shows a top view of an optical detector for determining the wavelength of an optical signal according to the invention. FIG. 1 includes a substrate 5 on which the rest of the structure shown in FIG. 1 is fabricated. Substrate 5 may be a block of semiconductor material, such as a block of undoped GaAs. FIG. 1 also shows a conductive layer 6 which covers the top of block 5. Conductive layer 6 may be a doped semiconductor material such as n+GaAs. A conductive pad 8, such as a metal pad, is positioned on conductive layer 6.

A block of semiconductor material 10 is positioned on conductive layer 6. Semiconductor block 10 may be an undoped semiconductor material such as GaAs. A plurality of conductive pads 7 are positioned on top of semiconductor block 10. Pads 7 are preferably metal pads. Each pad 7 has a width "1" and the spacing between the pads is "dl." Pads 7 delineate individual photodetectors. Pads 7 have a common node established by conductive layer 6. Substrate 5 supports the individual photodetectors of block 10.

In use, block 10 is positioned in the path of an optical signal 9. The energy bandgap of block 10 is less than optical signal 9. Optical signal 9 passes into block 10 and is partially absorbed thereby giving up some energy. The passage of optical signal 9 into block 10 causes each of the separately delineated photodetectors to produce a photocurrent which can be measured between the respective pad 7 and conductive layer 6. The photocurrents are indicated in FIG. 1 by the symbols $I_1$, $I_2$, $I_3$ and $I_n$. Each of photocurrents $I_1$ through $I_n$ can be measured and compared to determine the wavelength of optical signal 9.

In particular, a photocurrent $I_n$ at each of pads 7 comprises:

$$I_n = qF(1-R)(e^{-\alpha n(l+dl)} - e^{-\alpha(nl+(n-1)dl)})A \qquad (1)$$

where q is 1.6021E-19 coulombs, F is the photon flux density, R is the reflection coefficient of the semiconductor material, $\alpha$ is the optical absorption coefficient of the semiconductor material, 1 is the length of the pads along an axis along which the optical signal passes, dl is the distance between adjacent pads, A is the area of the photodetectors as shown in FIG. 2, and n is the number of the particular photodetector pad.

By dividing the current at the nth pad by the current at the first pad, a ratio $B_n$ comprises:

$$\beta_n = \frac{I_n}{I_1} = \frac{(e^{-\alpha n(l+dl)} - e^{-\alpha(nl+(n-1)dl)})}{(1-e^{-\alpha l})} \qquad [2]$$

By determining the ratio $B_n$, the unknown F in equation [1] is eliminated.

To determine the wavelength of the incoming optical signal 9, the photocurrent of the nth detector and the first detector are measured. The ratio $B_n$ is next determined. Because 1, n, and dl are known, $\alpha$ can be obtained mathematically by conventional methods. Once $\alpha$ is known, the wavelength can be learned from a lookup table.

In practice, substrate 5 in FIG. 1 is preferably a rectangular semiconductor substrate, conductive layer 6 is preferably an epitaxial or implant layer on one side of substrate 5, semiconductor block 10 preferably comprises a rectangular block having one side in contact with the conductive layer or coating 6 and having an opposite side on which pads 7 are positioned. Optical signal 9 is incident on a side of block 10 and passes into the block in a direction generally parallel to and between conductive layer 6 and pads 7. Substrate 5 and semiconductor block 10 are preferably an undoped semiconductor material such as GaAs and conductive layer 6 preferably comprises n+GaAs.

The plurality of photodetectors delineated by pads 7 have an axis along which optical signal 9 passes. Substrate 5 provides a support for supporting the photodetectors such that the axes of the photodetectors are coaxial. Opposing conductors comprising conductive layer 6 and pads 7 on the photodetectors of block 10 supply a photocurrent therebetween as optical signal 9 passes through and is partially absorbed by the photodetectors. These photocurrents can be measured and compared to determine the wavelength of optical signal 9.

Figure 3:
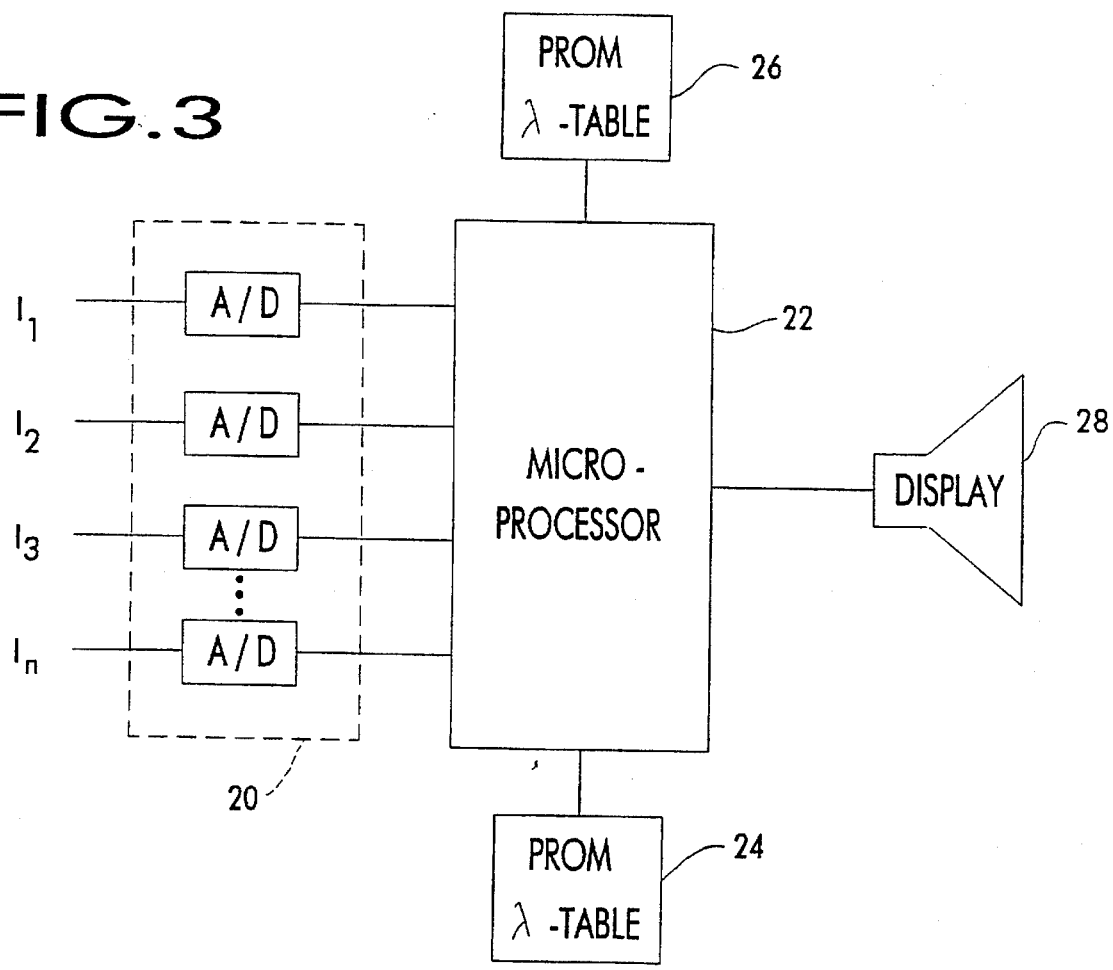
FIG. 3 is a block diagram of one preferred embodiment of a system according to the invention for use in combination with the optical detector of FIGS. 1 and 2 to determine the wavelength of optical signals incident on the optical detector.

FIG. 3 shows a block diagram of a system for use with the optical detector of FIGS. 1 and 2 in determining the wavelength of optical signal 9. $I_1$ through $I_n$ represent the photocurrents from the first through n photodetectors. An analog to digital converter 20 converts each of the analog photocurrents to a digital signal which digital signals are received by a microprocessor 22. Analog to digital converter 20 preferably converts the photocurrents into digital signals as a function of a magnitude of the photocurrents. Microprocessor 22 next calculates the ratio $B_n$ using equation [2] shown above. Microprocessor 22 then looks up the value of $\alpha$ as a function of the calculated ratio $B_n$ and the value n in a PROM $\lambda$-lookup table 24. Alpha lookup table 24 includes a table of values for $\alpha$ which are known as a function of $\lambda$. The table is prepared using known values of 1, n and dl and using equation [2]. Once $\alpha$ is known, microprocessor 22 looks up the value of the wavelength of optical signal 9 in PROM $\lambda$-lookup table 26. Microprocesser 22 then displays the value of $\lambda$ thus looked up on a display 28.

Figure 4:
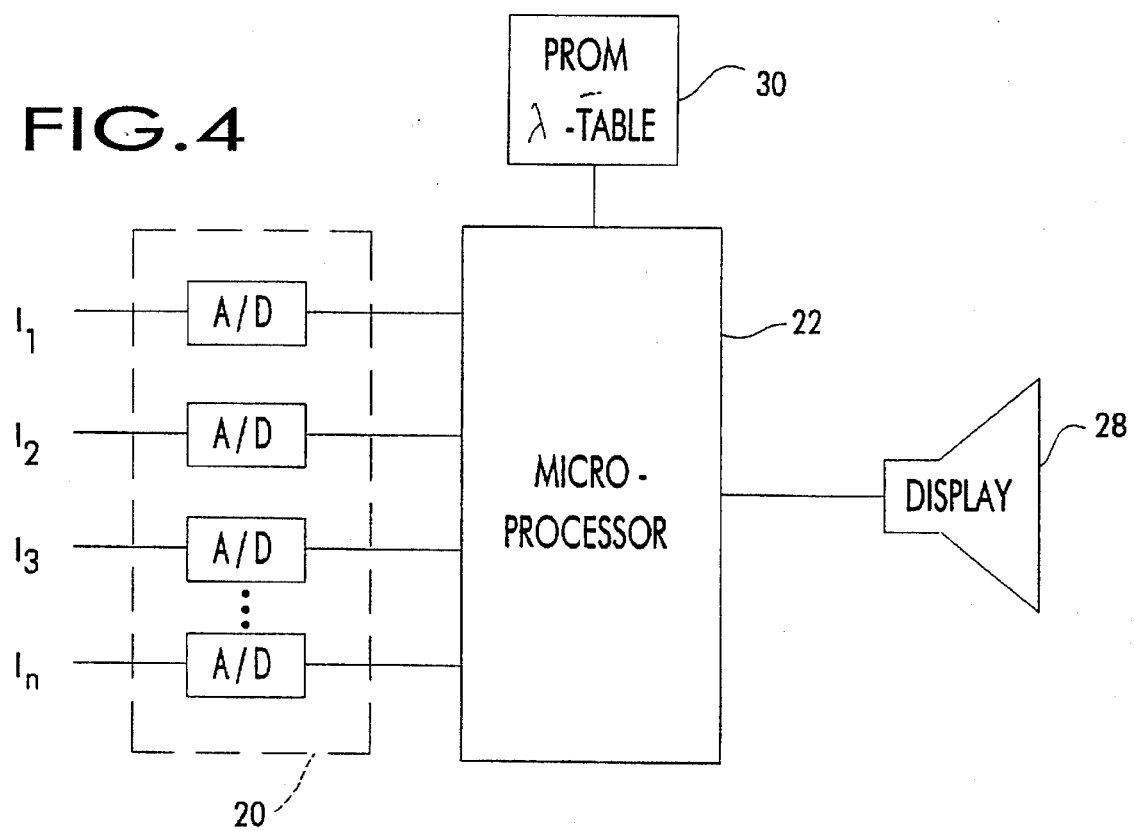
FIG. 4 is a block diagram of another preferred embodiment of a system according to the invention for use in combination with the optical detector of FIGS. 1 and 2 to determine the wavelength of optical signals incident on the optical detector.

FIG. 4 is a block diagram of another system for determining the wavelength $\lambda$ of optical signal 9. The block diagram of FIG. 4 is similar to FIG. 3 and similar components have been marked with similar reference numerals. The primary difference between the block diagrams of FIG. 4 and FIG. 3 is that FIG. 4 includes a memory 30 which directly relates a ratio $B_n$ and n to a wavelength $\lambda$. In use, analog to digital converter 20 converts each of the analog photocurrents to a digital signal which digital signals are received by microprocessor 22. Microprocessor 22 next calculates the ratio $B_n$ using equation [2]. Microprocessor 22 then looks up the value of $\lambda$ as a function of the calculated ratio $B_n$ and the value n in memory 30. Memory 30 includes a table of values for $\lambda$ which are known as a function of $B_n$ and n. The table is prepared using known values of 1, n and dl and using equation [2]. Microprocesser 22 then displays the value of $\lambda$ thus determined on display 28.

It is seen that FIGS. 3 and 4 provide a system for use with the optical detector of FIGS. 1 and 2 for determining the wavelength of optical signal 9. The system includes a plurality of photodetectors numbered 1 to n positioned sequentially in the path of optical signal 9. The photodetectors produce photocurrents $I_1$ through $I_n$ for use in determining the wavelength of optical signal 9 as the signal passes into the detectors. Analog to digital converter 20 receives the photocurrents and converts them into digital signals. Microprocessor 22 receives the digital signals and determines a ratio between them. Memories 24, 26 and/or 30 are accessible by microprocessor 22 for relating the ratio and the nth numbered detector to the wavelength $\lambda$. Display 28 is connected to microprocessor 22. Microprocessor 22 retrieves $\lambda$ from the memory as a function of the ratio and the nth numbered detector and displays the result on display 28.

The photodetectors of FIGS. 1 and 2 for producing photocurrents $I_1$ through $I_n$ for the system of FIGS. 3 and 4 each have an axis along which optical signal 9 passes. A support such as substrate 5 supports the photodetectors such that adjacent photodetectors are contiguous with each other and the axes of the photodetectors are coaxial. Opposing conductors on each of the photodetectors supply a photocurrent therebetween corresponding to optical signal 9 as said signal passes through the photodetectors and is partially absorbed.

It will be recognized by those skilled in the art that the invention may be practiced using semiconductor materials other than GaAs. Such other semiconductor materials include, but are not limited to, silicon and indium phosphide. The bandgap energy level may be altered to select a desired optical bandwidth by using compounds such as AlGaAs, InGaAs or InGaAsP. Other dopants may also be used to set a desired optical bandwidth for the optical detector within the scope of the invention.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. An optical detector for producing a plurality of photocurrents in response to an optical signal, the photocurrents for use in determining a wavelength of the optical signal, said optical detector comprising:

a semiconductor material in the path of the optical signal, said material having a bandgap energy less than an energy of the optical signal, said optical signal passing into the material;

a conductive layer on the semiconductor material;

a plurality of n conductive pads numbered 1 to n on the semiconductor material delineating individual photodetectors, said pads having a common node established by the conductive layer, wherein the optical detector produces a plurality of photocurrents between the pads and the conductive layer in response to the optical signal; and means to measure and compare the photocurrents at the plurality of n conductive pads so as to derive a ratio between the photocurrent of a first conductive pad and a second conductive pad to determine the wavelength of the optical signal.

2. The detector of claim 1 wherein a photocurrent $I_n$ at each of the pads is characterized such that:

$$I_n = qF(1-R)(e^{-\alpha n(l+dl)} - e^{-\alpha(nl+(n-1)dl)})A$$

where q is 1.6021E-19 coulombs, F is the photon flux density, R is the reflection coefficient of the semiconductor material, $\alpha$ is the optical absorption coefficient of the semiconductor material, 1 is the length of the pads along an axis along which the optical signal passes, dl is the distance between adjacent pads, A is the area of the photodetectors, and n is the number of the particular photodetector pad; and wherein the ratio of photocurrents between the first and second conductive pads is calculated as:

$$\beta_n = \frac{I_n}{I_1} = \frac{(e^{-\alpha n(l+dl)} - e^{-\alpha(nl+(n-1)dl)})}{1-e^{-\alpha l}}.$$

3. The detector of claim 1 wherein the semiconductor material comprises GaAs and wherein the conductive layer comprises n+GaAs.

4. The detector of claim 1 further comprising a rectangular semiconductor substrate; wherein the conductive layer is an implant layer on one side of the substrate; wherein the semiconductor material comprises a rectangular block having one side in contact with the conductive layer and having an opposing side on which the conductive pads are positioned; and wherein the optical signal is incident on a side of the block and passes into the block in a direction generally parallel to and between the conductive layer and the pads.

5. The detector of claim 1 further comprising a rectangular semiconductor substrate; wherein the conductive layer is an epitaxial layer on one side of the substrate; wherein the semiconductor material comprises a rectangular block having one side in contact with the conductive layer and having an opposing side on which the conductive pads are positioned; and wherein the optical signal is incident on a side of the block and passes into the block in a direction generally parallel to and between the conductive layer and the pads.

6. The detector of claim 5 wherein the substrate and the semiconductor material each comprise an undoped semiconductor material.

7. An optical detector for producing a plurality of photocurrents in response to an optical signal, the photocurrents for use in determining a wavelength of the optical signal, said optical detector comprising:

a plurality of photodetectors for receiving the optical signal, said photodetectors having an axis along which the optical signal passes;

an optical support for supporting the photodetectors such that the axes of the photodetectors are coaxial, wherein the optical support provides a media through which the optical signal may propagate;

opposing conductors on the photodetectors supplying a photocurrent therebetween as the optical signal passes through the photodetectors; and means to measure and compare the photocurrents at the plurality of photodetectors so as to derive a ratio between the photocurrent of a first conductive pad and a second conductive pad to determine the wavelength of the optical signal.

8. The detector of claim 7 wherein a photocurrent $I_n$ between each of the opposing conductors is characterized such that:

$$I_n = qF(1-R)(e^{-\alpha n(l+dl)} - e^{-\alpha(nl+(n-1)dl)})A$$

where q is 1.6021E-19 coulombs, F is the photon flux density, R is the reflection coefficient of the photodetector, $\alpha$ is the optical absorption coefficient of the photodetectors, 1 is the length of the pads along an axis along which the optical signal passes, dl is the distance between adjacent pads, A is the area of the photodetectors, and n is the number of the particular photodetector pad; and wherein the ratio of photocurrents between the first and second conductive pads is calculated as:

$$\beta_n = \frac{I_n}{I_1} = \frac{(e^{-\alpha n(l+dl)} - e^{-\alpha(nl+(n-1)dl)})}{1-e^{-\alpha l}}.$$

9. A system for determining a wavelength $\lambda$ of an optical signal, said system comprising:

a plurality of optical detectors numbered 1 to n positioned sequentially in the path of the optical signal, said detectors producing photocurrents for use in determining the wavelength of the optical signal as the signal passes into the detectors;

an analog to digital converter receiving the photocurrents and converting them into digital signals;

a microprocessor receiving the digital signals and determining a ratio therebetween;

a memory accessible by the microprocessor relating the ratio and the nth numbered detector to $\lambda$; and a display connected to the microprocessor;

wherein the microprocessor retrieves $\lambda$ from the memory as a function of the ratio and the nth numbered detector and displays the result on the display.

10. The system of claim 9 wherein the optical detectors each have an axis along which the optical signal passes; and wherein the system comprises:

a support for supporting the optical detectors such that adjacent optical detectors are continuous with each other and the axes of the optical detectors are coaxial; and opposing conductors on each of the optical detectors supplying a photocurrent therebetween corresponding to the optical signal as the optical signal passes through the optical detectors, whereby the optical detectors produce photocurrents in response to the optical signal which can be measured and compared to determine the wavelength of the optical signal.

11. The system of claim 9 wherein the memory includes a first look-up table relating the ratio and the nth numbered detector to an optical absorption coefficient $\alpha$ and includes a second look-up table relating $\alpha$ to $\lambda$;

wherein the microprocessor retrieves $\alpha$ from the first look-up table and retrieves $\lambda$ from the second look-up table.

12. The system of claim 10 comprising:

a substrate of undoped material;

a conductive layer of doped material on the substrate;

a contact on the conductive layer;

an undoped material layer on the conductive layer in the path of the optical signal, said undoped material layer having a bandgap energy less than the energy of the optical signal, said optical signal passing into the undoped material layer; and a plurality of n metalized pads numbered 1 to n on the undoped material layer delineating individual optical detectors, each having a common node established by the conductive layer, whereby the optical signal incident on and transmitted into the undoped material layer produces photocurrents between the pads and the contact, which photocurrents can be measured and compared to determine the wavelength of the optical signal.

13. The system of claim 9 wherein the analog to digital converter converts the photocurrents into digital signals as a function of a magnitude of the photocurrents.

* * * * *